United States Patent
Galton et al.

(10) Patent No.: US 6,697,004 B1
(45) Date of Patent: Feb. 24, 2004

(54) PARTIAL MISMATCH-SHAPING DIGITAL-TO-ANALOG CONVERTER

(75) Inventors: Ian Andrew Galton, Del Mar, CA (US); Jorge Alberto Grilo, Foothill Ranch, CA (US); Kevin Jia-Nong Wang, San Diego, CA (US)

(73) Assignee: Silicon Wave, Inc., San Diego, CA (US)

( * ) Notice: Subject to any disclaimer, the term of this patent is extended or adjusted under 35 U.S.C. 154(b) by 0 days.

(21) Appl. No.: 09/969,206

(22) Filed: Oct. 1, 2001

(51) Int. Cl.[7] ................................................ H03M 1/66
(52) U.S. Cl. ........................................ 341/144; 341/143
(58) Field of Search ................................. 341/144, 143, 341/155

(56) References Cited

U.S. PATENT DOCUMENTS

| | | | | |
|---|---|---|---|---|
| 5,345,344 A | * | 9/1994 | Kim ............................. | 360/26 |
| 5,404,142 A | | 4/1995 | Adams et al. ............... | 341/144 |
| 5,684,482 A | | 11/1997 | Galton ........................ | 341/144 |
| 6,326,912 B1 | * | 12/2001 | Fujimori ..................... | 341/110 |
| 6,340,940 B1 | * | 1/2002 | Melanson ................... | 341/143 |

OTHER PUBLICATIONS

Ian Galton, "Spectral Shaping of Circuit Errors in Digital-to-Analog Converters", IEEE Transactions on Circuits and Systems–II: Analog and Digital Processing, vol. 44, No. 10, Oct. 1997.

Fogleman, et al. "An Audio ADC Delta–Sigma Modulator with 100–dB Peak SINAD and 102–dB DR Using a Second–Order Mismatch–Shaping DAC", IEEE Journal of Solid–State Circuits, vol. 36, No. 3, Mar. 2001.

Ferguson, et al., "A Highly Linear Low–Power 10 bit DAC for GSM", IEEE Custom Integrated Circuits Conference, May, 2000 4 pages.

Fogleman, et al., "A 3.3–V Single–Poly CMOS Audio ADC Delta–Sigma Modulator with 98–dB Peak SINAD and 105–dB Peak SFDR"; IEEE Journal of Solid–State Circuits, vol. 35, No. 3, Mar. 2000.

* cited by examiner

*Primary Examiner*—Jean Jeanglaude
(74) *Attorney, Agent, or Firm*—Martin J. Jaquez, Esq.; Jaquez & Associates

(57) ABSTRACT

A novel mismatched-shaping DAC architecture is described. The inventive DAC partially spectrally shapes data conversion errors. In accordance with the present invention, the DAC mismatch-shaping function is fully effective for input signal amplitude levels that are relatively low (i.e., close to mid-scale), however, the mismatch-shaping function is not fully effective for input signal amplitude levels that are relatively high. This results in the simplification in complexity, reduced power dissipation, and shortened propagation delays associated with the mismatch-shaping DAC digital logic circuitry. Exemplary delta-sigma ADC and DAC architectures adapted for use with the present inventive partial mismatch-shaping DAC are also described.

23 Claims, 8 Drawing Sheets

PARTIAL MISMATCH-SHAPING DIGITAL-TO-ANALOG CONVERTER

BACKGROUND OF THE INVENTION

1. Field of the Invention

This invention relates to digital-to-analog converters (DACs), and more particularly to mismatch-shaping DACs.

2. Description of Related Art

Data converters, both digital-to-analog converters (DACs) and analog-to-digital converters (ADCs), are ubiquitous in applications involving digital signal processing of real-world signals such as those found in communication systems, instrumentation, and audio and video processing systems. A class of data converters referred to as delta-sigma data converters are widely used in many such applications requiring mododerate to high precision, and having low to moderate signal bandwidths. Using well known techniques such as oversampling relative to the bandwidth of the signal to be converted, coarse internal quantization, and quantization noise-shaping, delta-sigma data converters perform high-precision data conversion functions in VLSI circuits that are optimized for digital circuitry. While coarse quantization is used to simplify analog processing within the data converter, oversampling and quantization noise-shaping techniques are used to achieve high precision data conversion despite errors introduced by the coarse quantization.

As is well known in the VLSI circuit design arts, owing to a high sensitivity to analog component mismatches and other circuit errors present in at least one of the internal DACs, non-linearity is introduced into the signal of interest. Unlike other noise sources, the non-linearity, which can be modeled as additive error and is referred to as "DAC noise", is not attenuated by the processing chain and therefore directly degrades the overall signal-to-noise ratio (SNR) of the data converter. For example, and as described in more detail below with reference to the ADC 700 (of FIG. 7), the output of a feedback DAC 712 is subtracted directly from the input signal (provided on input line 716) via an adder 702. Any error that is introduced by the feedback DAC 712 is directly added to the input signal. Any distortion introduced by the DAC 712 is regarded as an integral part of the input signal itself, as it possesses the same transfer function to the output. Therefore, the portion of this error within the passband of the decimation filter 714 directly degrades the overall conversion accuracy.

To overcome the non-linearity introduced by the mismatched components, until recently the majority of delta-sigma data converters were designed using internal one-bit DACs. While one-bit DACs effectively overcame the component mismatching problem, they force design tradeoffs to be made that, for a given oversampling level, significantly reduce the data conversion SNR below what is achievable using multi-bit quantization. With this in mind, various "mismatch-shaping" DAC architectures have been developed. These architectures use digital algorithms to perform spectral shaping of noise introduced by non-ideal analog circuit behavior. The algorithms require no specific knowledge of the particular analog errors introduced by the circuit. In these applications, digital signal processing (DSP) techniques are used to shape the errors such that most of their energy lies outside of the data converter signal band. Component mismatches are accepted as inevitable, but their negative effects are mitigated by the DSP techniques.

One prior art mismatch-shaping DAC architecture is described in a paper written by Dr. Ian Galton, entitled "Spectral Shaping of Circuit Errors in Digital-to-Analog Converters", published in the IEEE Transactions on Circuits and Systems-II: Analog and Digital Signal Processing, Vol. 44, No.: 10, October 1997, referred to below as the Galton paper, and incorporated by reference in its entirety for its teachings on mismatch-shaping DACs. The DAC architectures described in this paper are also set forth in Dr. Galton's patent, U.S. Pat. No. 5,684,482, issued Nov. 4, 1997, also incorporated in its entirety herein for its teachings on mismatch-shaping DAC architectures. A DAC topology is described in both of the incorporated references that spectrally shapes the DAC noise caused by analog circuit component mismatches. As described in the incorporated U.S. patent, most of the mismatch-shaping DAC architectures generally take the form of the prior art DAC architecture 100 of FIG. 1.

As shown in the FIG. 1, the prior-art mismatch-shaping DAC architecture 100 typically includes a digital encoder 5 and N one-bit DACs referred to as unit DAC-elements 6. A digital input sequence x[n] is taken to be a sequence of non-negative integers less than or equal to N. Those of ordinary skill in the DAC design arts shall recognize that the digital input sequence can also comprise a signed representation. The sequence is provided as input to an input 9 of the digital encoder 5. The digital encoder 5 maps each input sample to N outputs $x_1[n], x_2[n], \ldots x_N[n]$ 10 such that the sum of the N outputs is equal to x[n]:

$$x_1[n]+x_2[n]+x_3[n]+\ldots +x_N[n]=x[n] \qquad \text{Equation 1}$$

Each output bit $x_i[n]$ is provided as a corresponding input 12 to the unit DAC-elements 6. The unit DAC-elements 6 operate to create N output signals $y_1[n], y_2[n], y_N[n]$ on respective outputs 16. Each output signal $y_i[n]$ is then provided as an input to an adder 19 which sums the outputs to create an analog signal y[n] on an output 20.

The digital encoder 5 sets x[n] of its N output bits to be high, and the remaining N−x[n] of its N output bits are set low. This enables 1-bit DACs 6 appropriately to convert the digital signal to a numerically equivalent analog output signal. If the 1-bit DACs 6 were to introduce no errors into their respective output signals, the output 20 y[n] of the DAC 100 would equal the input 9, x[n], exactly. However, in practice, the errors are not zero because of the non-ideal circuit behavior described above. Non-ideal circuit behavior results in a gain error, a non-zero DC offset, and non-zero DAC noise.

The digital encoder 5 can be implemented in a variety of ways to select its output bits $x_i[n]$ and satisfy Equation 1 (above). Thus, the digital encoder 5 can modulate the DAC noise component of y[n] without affecting the signal component. The mismatch-shaping DACs perform this modulation such that the DAC noise is spectrally shaped in a manner that is similar to delta-sigma modulator quantization noise.

Another exemplary mismatch-shaping DAC topology 100' is described in the incorporated U.S. patent and shown in FIG. 2. The number format used to represent the digital input value is unimportant as any convenient digital representation can be used. In the example shown in FIG. 2, the input bus 113 is 4-bits wide to accommodate the possibility of the number eight, represented by the binary number $1000_2$. The topology 100' is a special case of the topology 100 shown in FIG. 1. As shown in FIG. 2 and described in more detail in the incorporated patent, the digital encoder 5 of FIG. 1 is replaced with the digital logic 110 of FIG. 2. The digital logic 110 of FIG. 2 comprises three layers of digital devices called switching blocks 120–126 and labeled $S_{k,r}$, where k denotes a layer number and r denotes a position of the switching block 120–126 in its respective layer. Additionally, the topology 100' includes eight one-bit DACs 130–137 coupled to an adder 169. A digital signal x[n] is input into the switching block 120 via an input bus 113. The switching block 120 splits the input signal into two 3-bit output signals on outputs 140 and 141. The signal on output 140 is fed to an input 142 of the switching block 121, while the signal on output 141 is fed to an input 143 of the switching block 122. The switching blocks 121 and 122 receive the respective three-bit signals on the inputs 142 and 143 and split them into four two-bit output signals on outputs 144–147. These output signals are applied as inputs 148–151 of the next layer of switching blocks comprising the blocks 123–126. In particular, the signal on the output 144 from the switching block 121 is fed to the input 148 of the switching block 123; the signal on the output 145 from the switching block 121 is fed to the input 149 of the switching block 124; the signal on the output 146 from the switching block 122 is fed to the input 150 of the switching block 125; and the signal on the output 147 from the switching block 122 is fed to the input 151 of the switching block 126. The switching blocks 123–126 convert the four two-bit signals on the inputs 148–151 into eight one-bit signals on the outputs 152–159. These one-bit signals are represented as $x_1[n]$, $x_2[n]$, . . . $x_8[n]$, respectively. As described in detail in the incorporated U.S. patent, the switching blocks 120–126 must satisfy a number conservation rule which states that two outputs of each switching block must be in the range of $\{0, 1, \ldots, 2^{k-1}\}$ where k is the layer number (i.e., Layer 1, Layer 2, Layer 3, etc.), and the sum of the outputs must equal the value of the input to the switching block.

The complexity of the prior art digital encoders increases exponentially with the number of input bits. Consequently, as the number of input bits increases, the prior art mismatch-shaping DACs require that an increased portion of integrated circuit area be dedicated for the digital encoder logic function. In addition, the digital logic used to implement the encoder introduces undesirable signal propagation delays and increased power dissipation into the overall DAC architecture. Propagation delays are particularly problematic in high speed delta-sigma ADC designs as signals are often required to propagate through the digital encoder in significantly less than one clock cycle. Therefore, any propagation delay introduced by the digital encoder can limit the performance capabilities of the DAC.

The inventors have observed that, for some applications, and particularly for applications wherein peak signal-to-noise ratio (SNR) is a less important DAC performance criterion than dynamic range (where dynamic range is defined as the range over which the signal can be processed with "acceptable" SNR, as determined from system requirements), the mismatch-shaping function should be fully effective when the input signal amplitude level is relatively low (i.e., close to "mid-scale"). However, for these applications, the mismatch-shaping function can be less effective when the input signal amplitude level is relatively high. For example, in some wireless communication applications such as those designed in compliance with the well-known "Bluetooth" wireless LAN standard, mismatch-shaping of DAC noise is important when the input signal amplitude level is low. In wireless devices designed for the Bluetooth specification, for example, errors introduced by DAC component mismatches can be tolerated when the input amplitude level is relatively large, however the errors can be problematic when the input amplitude level is relatively low. The SNR curves of three exemplary mismatch-shaping DACs are shown in FIG. 3.

FIG. 3 shows a plot 30 of an input signal power level versus signal-to-noise ratio (SNR) (which is proportional to the square of the amplitude) for various mismatch-shaping DACs. As shown in FIG. 3, an ideal plot of the input signal versus SNR is a straight line 32 having a slope of one. More realistic curves 34 and 36 show how the SNR of the DACs can be affected by conversion noise. Curve 34 shows a plot of the input signal versus SNR for a prior art mismatch-shaping DAC wherein mismatch shaping is implemented over the full input signal range. Curve 36 shows a plot of the input signal versus SNR for a "partially" mismatch-shaping DAC wherein mismatch shaping is fully implemented only for input signals within a restricted range about the mid-scale point. As shown in FIG. 3, for larger amplitude levels, the peak SNR is reduced in curve 36 as compared with peak SNRs for equivalent amplitude levels in the curves 32 and 34. However, as described above, in some applications, the dynamic range shown in curve 36 is sufficient to meet the data conversion requirements. By fully implementing mismatch shaping only for those input signals that fall within a restricted range about the mid-scale point (i.e., by "partially mismatch-shaping" the input signals) as shown in curve 36, and thereby only partially mismatch-shaping the DAC conversion noise, a design tradeoff is possible which reduces the complexity of the digital encoder at the sacrifice of reduced SNR for larger-amplitude input signals. In some applications, this design tradeoff is an attractive alternative to the use of prior art mismatch-shaping DACs.

The present invention provides an inventive partial mismatch-shaping DAC architecture that spectrally shapes the DAC noise contributed by component mismatches.

SUMMARY OF THE INVENTION

A novel partial mismatch-shaping DAC architecture is described. The partial mismatch-shaping DAC spectrally shapes data converter errors caused by mismatched components. In some applications, a design tradeoff can be made whereby only a subset of internal DACs are mismatch-shaped. In these applications, the mismatch-shaping function is fully effective when the input amplitude level is relatively low, however, the mismatch-shaping function is not fully effective when the input amplitude level is high. This results in savings in complexity, reduced power dissipation and shortened propagation delays associated with the DAC digital logic circuitry.

The inventive DAC includes a digital encoder including at least one pass-through encoding block and a mismatch-shaping logic block. The DAC also includes a plurality of internal one-bit DAC elements, the outputs of which are coupled to an adder. The input to the inventive DAC is divided into input signal components. In one embodiment, the input is split into three components: $x_{HIGH}[n]$, $x_{MID}[n]$, and $x_{LOW}[n]$. The high and low components, $x_{HIGH}[n]$, and $x_{LOW}[n]$, respectively, comprise amplitude levels of the input signal that are relatively large in magnitude (relative to mid-scale). The middle component $x_{MID}[n]$ comprises amplitude levels of the input signal that are relatively small in magnitude (i.e., input signal amplitude levels close to mid-scale). In accordance with the present inventive DAC, mismatch-shaping is performed only on the middle component $x_{MID}[n]$. Mismatch-shaping is not performed on the high and low components $x_{HIGH}[n]$, and $x_{LOW}[n]$, or on their associated internal DAC inputs.

The inventive DAC can be used in implementing internal DACs of delta-sigma ADCs and delta-sigma DACs. Exemplary delta-sigma ADC and DAC architectures adapted, for use with the present inventive DAC are also described.

BRIEF DESCRIPTION OF THE DRAWINGS

Like reference numbers and designations in the various drawings indicate like elements.

DETAILED DESCRIPTION OF THE INVENTION

Throughout this description, the preferred embodiment and examples shown should be considered as exemplars, rather than as limitations on the present invention.

The present invention is a partial mismatch-shaping DAC that spectrally shapes noise contributed by conversion errors in digital-to-analog converters (DACs). In accordance with the present invention, mismatch-shaping is fully effective only when the input amplitude levels are relatively low (i.e., near mid-scale). Mismatch-shaping is not fully effective when the input amplitude levels are high. This results in reduced complexity, size and power dissipation of DAC digital logic circuitry compared to prior art implementations.

Figure 4:
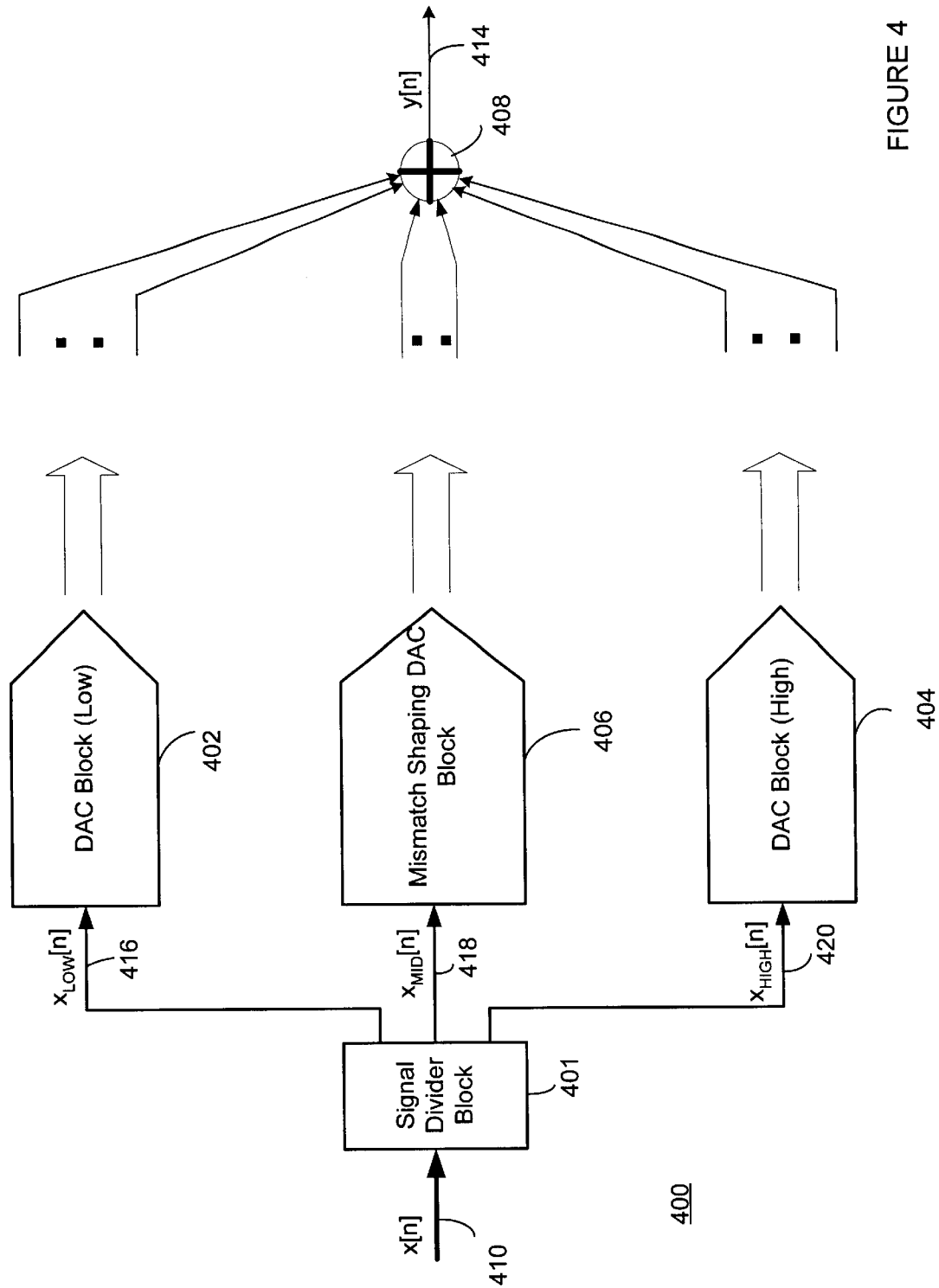
FIG. 4 is a simplified block diagram of a mismatch-shaping DAC architecture in accordance with the present invention.

FIG. 4 shows a simplified block diagram of a partial mismatch-shaping DAC 400 made in accordance with the present invention. As shown in FIG. 4, the inventive partial mismatch-shaping DAC 400 includes a signal divider block 401, a first DAC block 402, a second DAC block 404, a mismatch-shaping DAC block 406, and an adder 408. A digital input signal x[n] is input to the DAC 400 on an input signal line 410. The digital input signal x[n] is a digital representation of a signal to be converted by the DAC 400. Those of ordinary skill in the DAC design art shall recognize that any convenient digital representation can be used in practicing the present invention. In accordance with the present invention, before being input to the DAC blocks 402–406, the digital input signal x[n] is divided into separate components by the signal divider block 401. For example, in the embodiment of FIG. 4, the digital input signal x[n] is split into three components: $x_{LOW}[n]$, $x_{MID}[n]$, and $x_{HIGH}[n]$. The low and high components, $x_{LOW}[n]$ and $x_{HIGH}[n]$, respectively, comprise input signal x[n] amplitude levels that are relatively large in magnitude (i.e., values that are not near mid-scale). The middle or "mid" component of the input signal x[n], $x_{MID}[n]$, comprises input signal amplitude levels that are relatively small in magnitude (i.e., input signal amplitude levels close to mid-scale).

Figure 3:
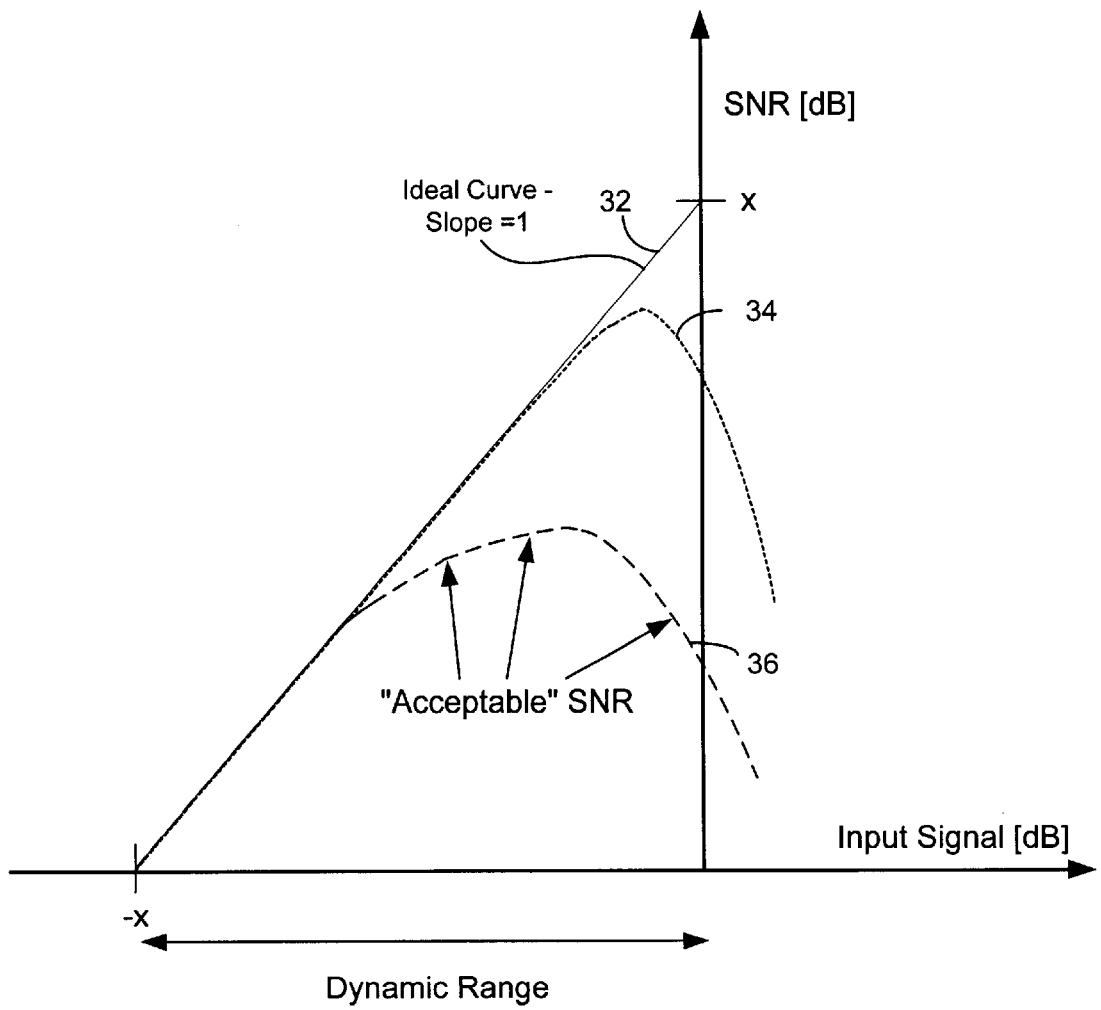
FIG. 3 is a plot of input signal power level versus signal-to-noise ratio (SNR) for various mismatch-shaping DACs.

In accordance with the present invention, and as described in more detail below, mismatch-shaping is performed on the middle component $x_{MID}[n]$ using the mismatch-shaping DAC block 406. Mismatch-shaping is not performed on the low and high components $x_{LOW}[n]$, and $x_{HIGH}[n]$ (for example, when the input is encoded using a thermometer code, the inputs are passed directly through to internal DAC elements). As described above with reference to FIG. 3, the present invention takes advantage of the observation that, in some applications, a design tradeoff can be made whereby mismatch-shaping of DAC circuit errors is fully effective only when the input signals are relatively small (i.e., when the input signals are relatively close to mid-scale). As shown in FIG. 3 and as described above, although some SNR is sacrificed by not permuting all of the DAC inputs, this is acceptable in some applications. Referring again to FIG. 4, the DAC blocks 402–406 generate analog output signals that are input to the adder 408. The adder 408 sums the DAC outputs and generates an analog output signal y[n] on output signal line 414.

As described, in one embodiment of the present invention, the input signal x[n] is split into three components $x_{LOW}[n]$, $x_{MID}[n]$, and $x_{HIGH}[n]$ by the signal divider block 401. By way of example, assume that the input signal x[n] represents any one of possible integer values between zero and sixteen {0, 1, 2, ... 16}. In this example, if the input signal x[n]<=4, then: $x_{HIGH}[n]$=0; $x_{MID}[n]$=0; and $x_{LOW}[n]$=x[n]. If 4<x[n] <=12, then: $x_{HIGH}[n]$=0; $x_{MID}[n]$=x[n]–4; and $x_{LOW}[n]$=4. Finally, if the input signal x[n]>12, then: $x_{HIGH}[n]$=x[n]–12; $x_{MID}[n]$=8; and $x_{LOW}[n]$=4. As shown in FIG. 4, the three components $x_{LOW}[n]$, $x_{MID}[n]$, and $x_{HIGH}[n]$, are input to the DAC blocks 402–406 on the input signal lines 416, 418, and 420, respectively. The complexity of the digital encoder used to mismatch shape the $x_{MID}[n]$ component is reduced as compared to the complexity of a digital encoder that would be required to mismatch shape all of the DAC inputs. The power dissipation and propagation delays associated with the digital encoder are also reduced.

Figure 5:
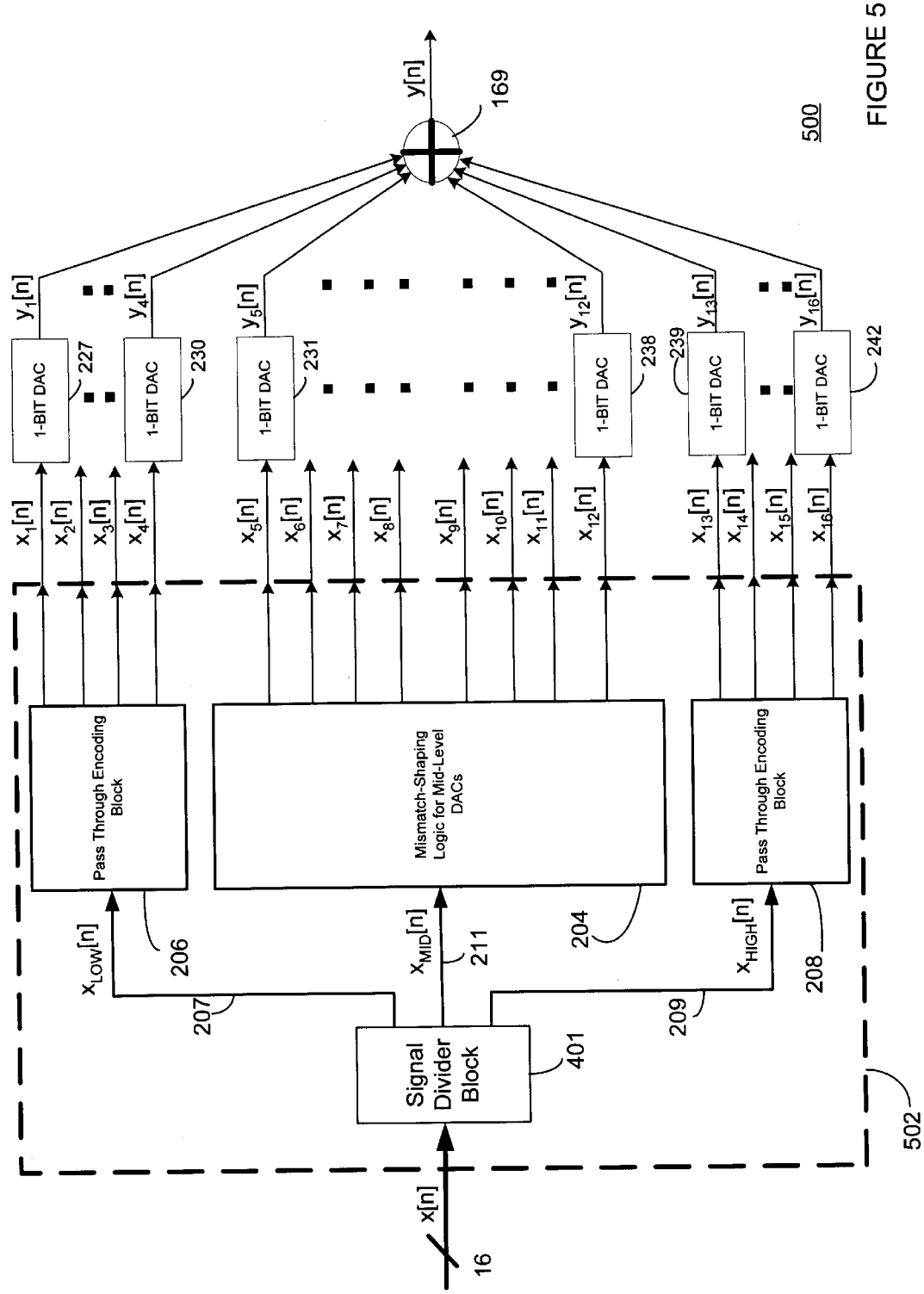
FIG. 5 is a block diagram of a mismatch-shaping DAC including 16 internal one-bit DACs.

FIG. 5 is a block diagram of one specific embodiment of a partial mismatch-shaping DAC 500 made in accordance with the present invention. Although a seventeen-level DAC is shown in FIG. 5, those skilled in the DAC design arts shall recognize that the invention can be generalized to accommodate a digitally encoded input signal having any number of levels and using any number of internal DACs. As shown in FIG. 5, the inventive partial mismatch-shaping DAC 500 includes a digital logic block 502, sixteen one-bit DACs 227–242, and an adder 169. The digital logic block 502 includes a signal divider block 401, a pair of pass-through encoding blocks 206, 208, and a mismatch-shaping logic block 204.

In accordance with the present invention, and as described above with reference to FIG. 4, the input signal x[n] is divided into three components by the signal divider block 401 before being input to the internal one-bit DAC elements: $x_{LOW}[n]$, $x_{MID}[n]$, and $x_{HIGH}[n]$. The low and high components, $x_{LOW}[n]$, and $x_{HIGH}[n]$, of the input signal x[n], are provided as inputs to the pass through encoding blocks 206, 208 on input signal lines 207 and 209, respectively. The middle or "mid" component $x_{MID}[n]$ is provided as input to the mismatch-shaping logic block 204 on input signal line 211. In the embodiment shown in FIG. 5, $x_{MID}[n]$ comprises the 8 middle values of the input signal x[n] (i.e., the values of the input signal close to mid-scale). In this embodiment, the high and low components of the input signal x[n], $x_{HIGH}[n]$, and $x_{LOW}[n]$, comprise the four most significant bits ($x_{HIGH}$) and the four least significant bits ($x_{LOW}$) of the input signal, respectively. Those skilled in the DAC design art shall appreciate that the number of bits used for the components of the input signal can be varied without departing from the spirit or the scope of the present invention.

As described above with reference to FIG. 4, the mismatch shaping function provided by the present inventive DAC 500 is fully effective only over a selected range of input values. In the embodiment shown in FIG. 5, mismatch-shaping is performed only on the middle component $x_{MID}[n]$ of the input signal x[n]. Mismatch-shaping is not performed on the high and low components of the input signal. More specifically, when the input signal x[n] is encoded using a thermometer code, the high and low components are passed directly through to their respective DAC inputs. For example, $x_{LOW}[n]$ is passed directly through to $x_1[n]$–$x_4[n]$. Similarly, $x_{HIGH}[n]$ is passed directly through to $x_{13}[n]$–$x_{16}[n]$. Those skilled in the DAC design arts shall recognize that the encoding blocks 206 and 208 function to encode the low and high components of the input signal, respectively, when the input signal is not originally encoded using a thermometer code. For example, in one embodiment, the encoding blocks first perform a binary code to thermometer code conversion before passing the input signals through to their respective DAC elements.

Figure 1:
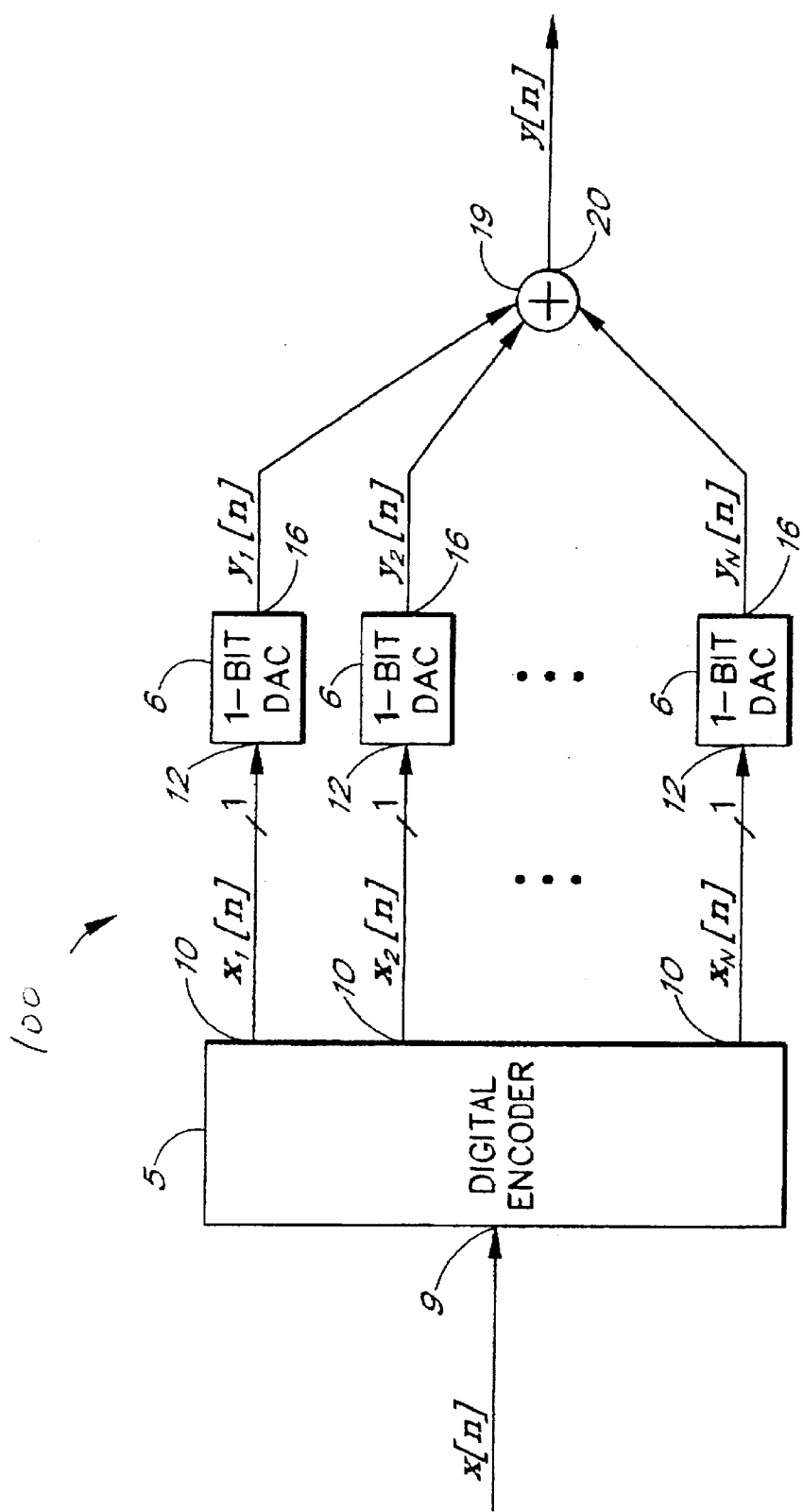
FIG. 1 is a simplified block diagram of an exemplary prior art mismatch-shaping DAC architecture.
Figure 2:
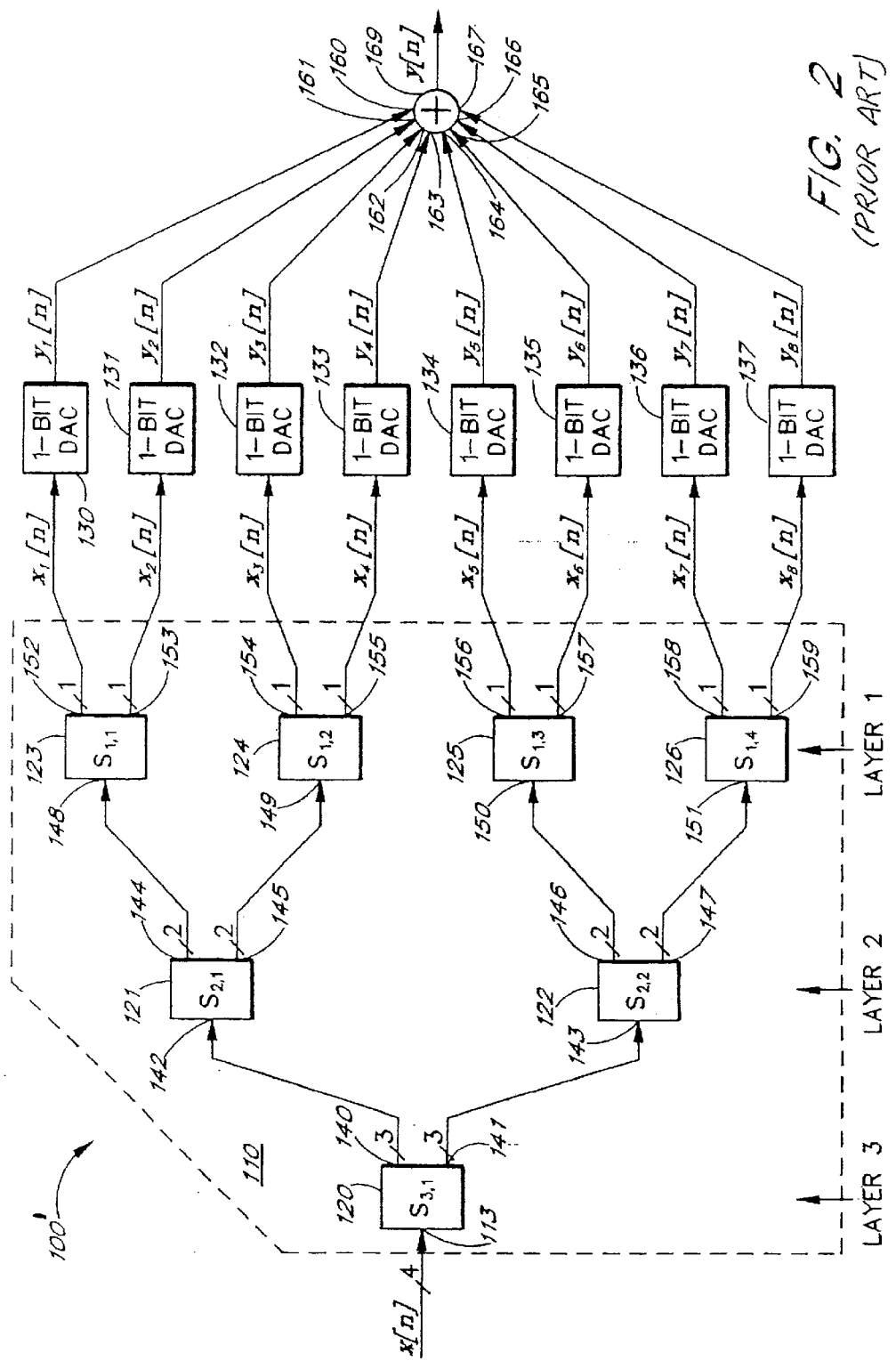
FIG. 2 is a block diagram of an exemplary mismatch-shaping DAC topology showing details of the digital encoder of FIG. 1.

The mismatch-shaping logic block 204 is operatively coupled to the "mid-level" internal DAC elements 231–238. In one embodiment of the mismatch-shaping logic block 204, the input signals are permuted to the inputs of the one-bit DACs 231–238. More specifically, the eight one-bit outputs of the mismatch-shaping logic block 204 are provided as inputs $x_5[n]$–$x_{12}[n]$, to their associated and respective one-bit DACs 231–238. The mismatch-shaping logic block 204 shapes the DAC noise caused by mismatches among nominally identical components in the one-bit DACs using any of the well known mismatch-shaping techniques. For example, in one embodiment, the mismatch-shaping logic block 204 is implemented using a "tree-structured" switching block architecture described above with reference to FIG. 2. This architecture is described in more detail in the incorporated U.S. patent and in the incorporated Galton paper.

In another embodiment, the present invention can be achieved by replacing the one-bit DACs 227–242 of FIG. 5 with multiple-bit DACs. For example, if a two-bit DAC replaces each one-bit DAC, one layer of switching blocks is removed. If desired, this theory allows multiple layers of switching blocks to be replaced by multiple bit DACs.

The present invention is not limited to use of the tree-structured switching block architecture, as any other convenient means can be used to implement the mismatch-shaping logic block 204 of FIG. 5. For example, in another embodiment of the present invention, the mismatch-shaping logic block 204 is implemented in accordance with the design taught by U.S. Pat. No. : 5,404,142, issued to Adams, et al., on Apr. 4, 1995, entitled "Data-directed Scrambler for Multi-bit Noise Shaping D/A Converters", also incorporated by reference herein for its teachings on noise-shaping DACs. Those skilled in the DAC design art shall recognize that other methods of implementing the mismatch-shaping logic block 204 can be used without departing from the scope and spirit of the present invention. For example, element rotation, vector feedback, and butterfly shuffler algorithms can be used.

By reducing the number of inputs provided to the mismatch-shaping logic block 204, the present inventive DAC architecture 500 reduces the complexity, power dissipation, and propagation delays associated with the DAC mismatch-shaping function. The complexity of the digital logic block grows exponentially with the number of inputs. The IC real estate required by the digital logic block is therefore reduced by reducing the number of inputs of the mismatch-shaping logic block 204, thus making more IC area available for the implementation of other functions. Less power is consumed and propagation delays are reduced using the present inventive DAC architecture.

Those skilled in the data converter design arts shall appreciate that the present invention is not limited to the exemplary embodiments shown in FIGS. 4 and 5. The present inventive method and apparatus can be used with any number of one-bit DACs and any digital input signal representation. In addition, although the architecture of the inventive DACs of FIGS. 4 and 5 shows mismatch-shaping of the "middle" internal DAC elements, any of the internal DACs can be mismatch-shaped, not just the middle DACs. Those skilled in the DAC design art shall recognize that modifications to the DAC architectures of FIGS. 4 and 5 can be made to accommodate system parameters.

The DAC architecture of the present invention can be used in any application where partial mismatch-shaping is desired. For example, the present inventive DAC can be used to implement a stand-alone DAC. In addition, the present inventive DAC can be used to implement an internal feedback DAC in a delta-sigma ADC. In addition, the inventive DAC can be used to implement an internal DAC in a delta-sigma DAC. These implementations are now discussed with reference to FIGS. 6–8.

Figure 6:
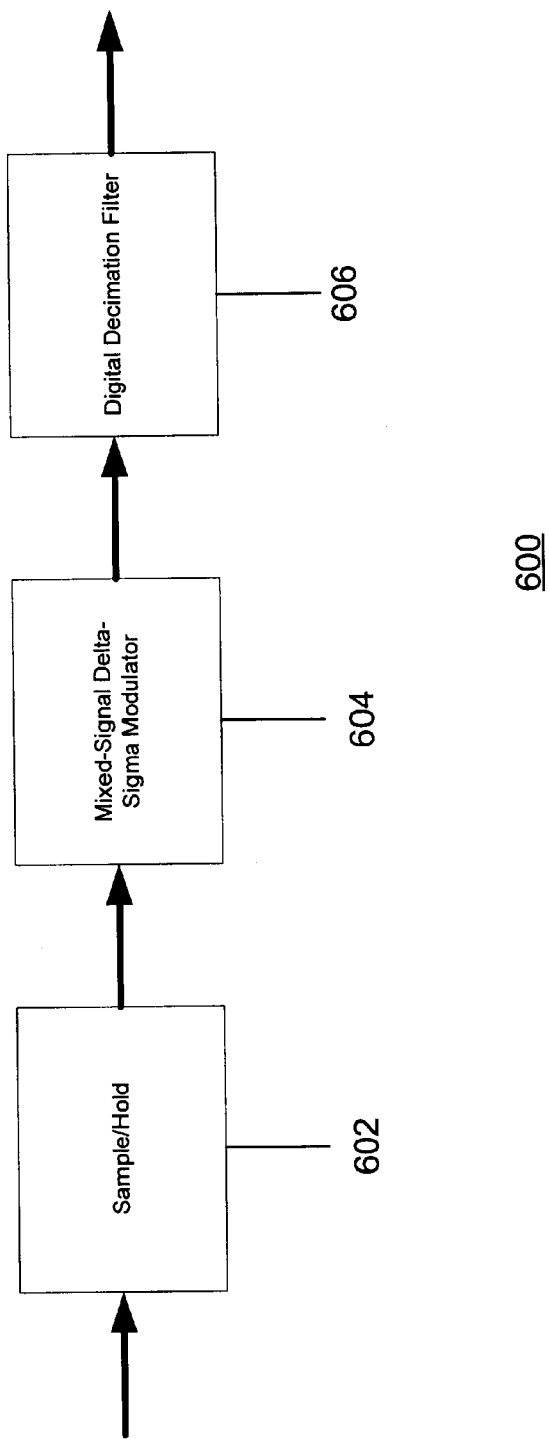
FIG. 6 is a high-level functional block diagram of an exemplary delta-sigma ADC.

FIG. 6 shows a high-level functional block diagram of an exemplary delta-sigma ADC 600. The exemplary delta-sigma ADC 600 comprises a sample-and-hold block 602, a mixed-signal delta-sigma modulator 604, and a digital low-pass decimation filter 606. In most implementations, the sample-and-hold block 602 is built into the delta-sigma modulator 604. One implementation of the delta-sigma ADC is shown in the block diagram of FIG. 7.

With the exception of the use of the present inventive partial mismatch-shaping DAC, many of the components of the exemplary delta-sigma ADC 700 are described in detail in a paper authored by Fogleman, et al., entitled "A 3.3-V Single-Poly CMOS Audio ADC Delta-Sigma Modulator with 98-dB Peak SINAD and 105-dB Peak SFDR", published in the IEEE Journal of Solid-State Circuits, Vol. 35, No. 3, in March 2000, and incorporated herein in its entirety for its teachings on delta-sigma modulators. The delta-sigma modulator is also based in large part on a second-order delta-sigma modulator implemented with two delaying integrators, the design of which is described in a paper authored by Lainey, et al., entitled "Switched-capacitor Second-order Noise-shaping Coder," published in Electron. Lett., Vol. 19, at pages 149–150, in February, 1983. The Lainey paper is also incorporated herein in its entirety for its teachings on second-order delta-sigma modulators.

Figure 7:
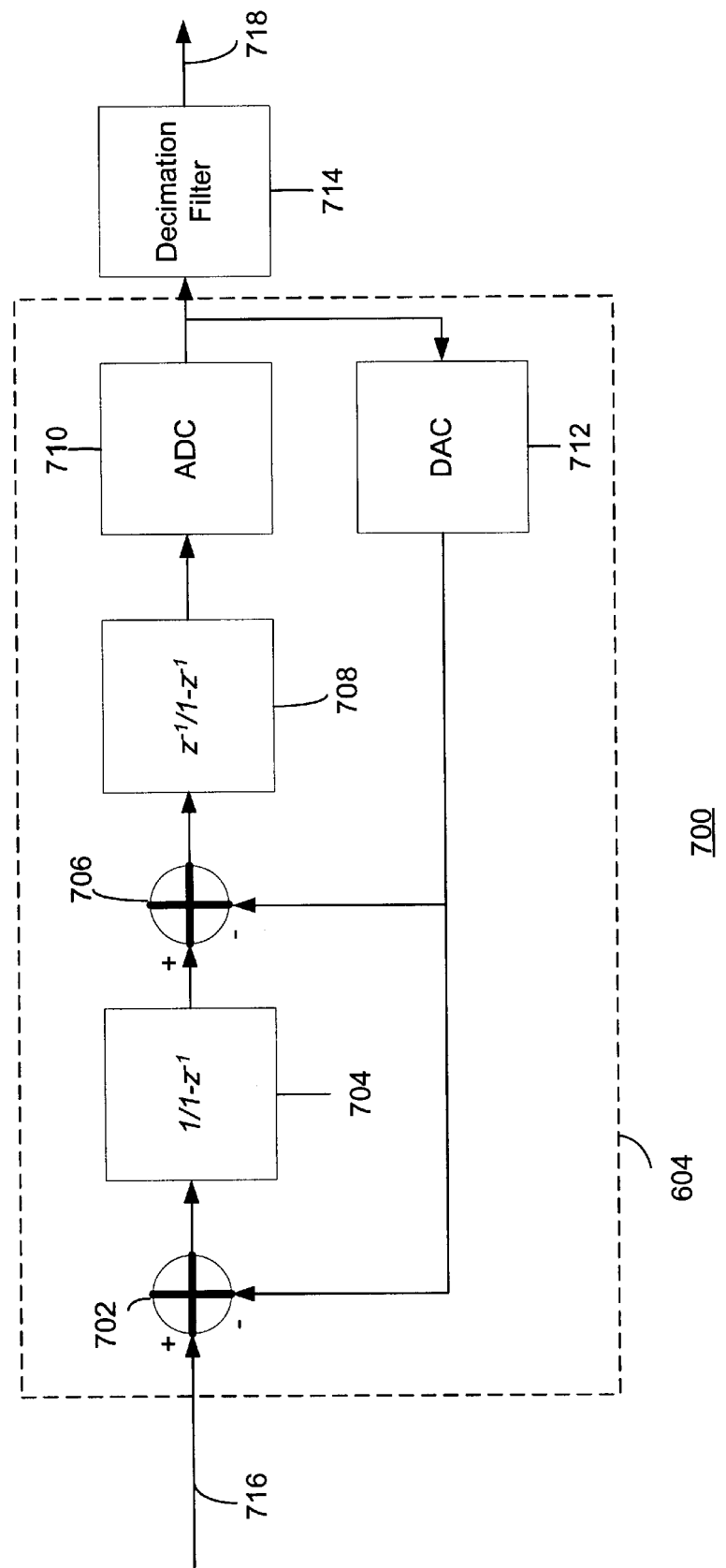
FIG. 7 shows a simplified block diagram of an exemplary implementation of the delta-sigma ADC of FIG. 6 adapted for use with the present invention.

As shown in FIG. 7, the delta-sigma ADC 700 includes a first adder 702, a first integrator 704, a second adder 706, a second integrator 708, a flash ADC 710, an internal partial mismatch-shaping feedback DAC 712 made in accordance with the present invention, and a decimation filter 714. Those skilled in the ADC design arts shall recognize that the exemplary delta-sigma ADC can be implemented using multiple delaying integrators without departing from the scope or spirit of the present invention. The delta-sigma modulator 604 generates a digital output sequence that is input to both the decimation filter 714 and the inventive feedback DAC 712. Those skilled in the ADC design arts shall recognize that one can, or may need to use a separate feedback DAC for each feedback path present in the ADC. The decimation filter 714 removes undesired input signal components and quantization noise above a selected frequency. The output of the decimation filter 714 is a highly accurate digital representation of a desired component of the continuous-time analog input signal input on signal line 716.

In the delta-sigma ADC 700 shown in FIG. 7, the output of the feedback DAC 712 is subtracted directly from the input of the delta-sigma modulator via the adder 702. Any error introduced by the feedback DAC 712 therefore adds directly to the delta-sigma modulator input sequence. The portion of this error within the passband of the decimation filter 714 directly degrades the overall conversion accuracy. Using the inventive partial mismatch-shaping DAC 712, errors from component mismatches are suppressed within a desired narrow signal band and uncorrelated with the input sequence provided on input signal line 716. The partial mismatch-shaping DAC 712 in the feedback path causes the power of the DAC noise arising from static DAC mismatch errors to fall predominantly outside of the signal band, provided that the input to the DAC remains within a small region about mid-scale. This significantly relaxes the matching requirements of the DAC analog components. As described above with reference to FIGS. 4 and 5, the complexity of the mismatch-shaping feedback DAC is reduced by only partially mismatch-shaping the conversion errors. In some applications, partially mismatch-shaping DACs perform adequately to meet system parameters.

Figure 8:
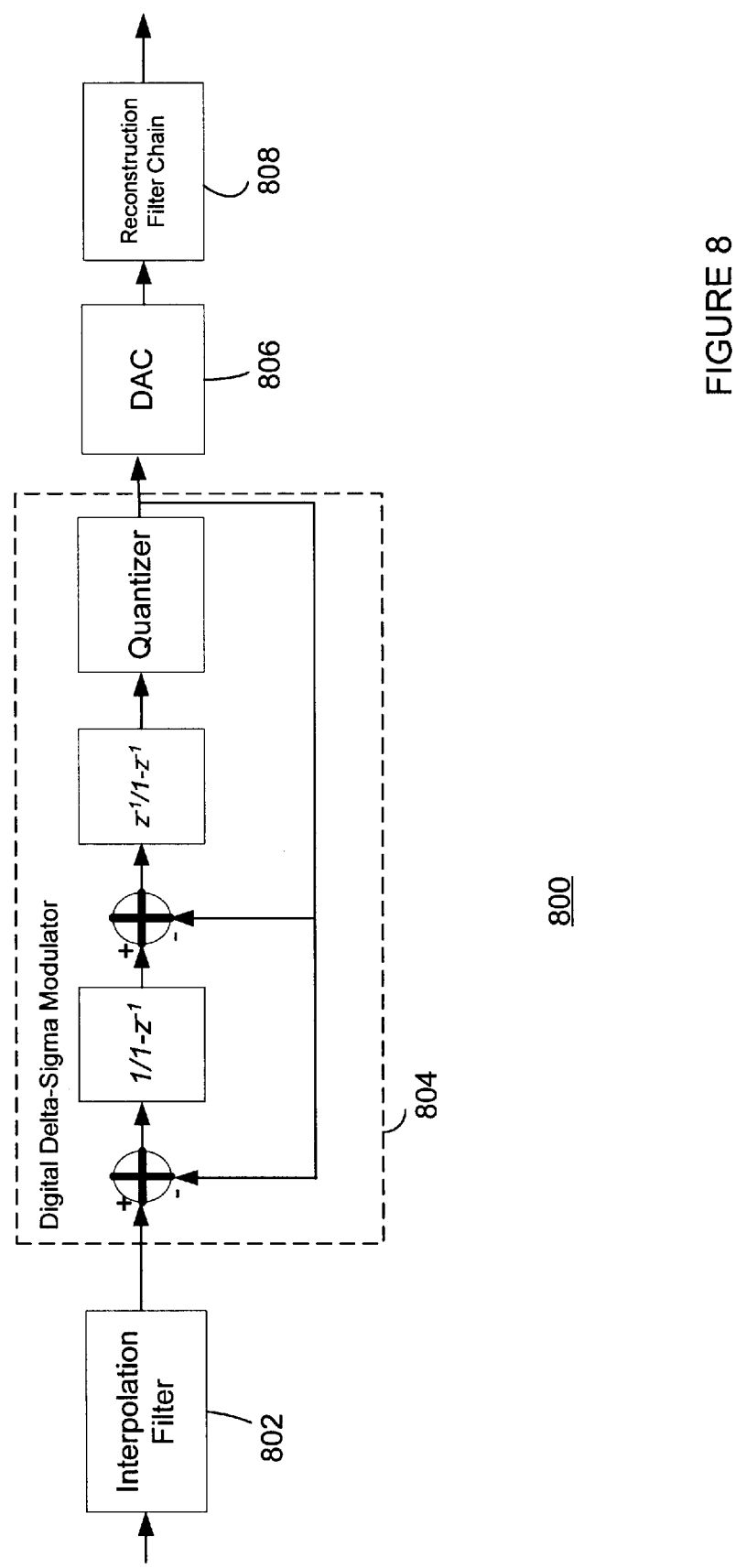
FIG. 8 shows a simplified block diagram of an exemplary delta-sigma DAC adapted for use with the present invention.

The present inventive DAC architecture can also be used in other applications. For example, the present inventive DAC architecture can be used to implement an internal DAC in a delta-sigma DAC. FIG. 8 shows a simplified block diagram of an exemplary delta-sigma DAC adapted for use with the present invention. As shown in FIG. 8, the delta-sigma DAC 800 includes an interpolation filter 802, a digital delta-sigma modulator 804, the inventive DAC 806 and a reconstruction lowpass analog filter chain 808. Any error introduced by the internal DAC 806 within the passband of the reconstruction filter chain 808 degrades the overall D/A conversion accuracy of the delta-sigma DAC 800. As described above, very often the dominant sources of error in a coarse DAC are mismatches among nominally identical components. VLSI fabrication errors result in mismatches among capacitors with a standard deviation rarely lower than 0.1% in practice. Such mismatches give rise to fixed errors in the DAC output levels, and these errors give rise to data-dependent nonlinear distortion. As described above, the negative effects of these errors are mitigated using the present inventive mismatch-shaping DAC 806. In applications where reduced mismatch-shaping performance for large amplitude signals can be tolerated, the inventive partial mismatch-shaping DAC 806 can be used to reduce the complexity and propagation delays typically associated with mismatch-shaping DACs.

A number of embodiments of the present invention have been described. Nevertheless, it will be understood that various modifications may be made without departing from the spirit and scope of the invention. For example, the present inventive method and apparatus can use any convenient technique to spectrally shape the input signal. Also, although the present invention can be adapted for use in wireless communication systems, it can also be used in any system where high precision data conversion is desired. Accordingly, it is to be understood that the invention is not to be limited by the specific illustrated embodiments, but only by the scope of the appended claims.

What is claimed is:

1. A mismatch-shaping digital-to-analog converter (DAC) partially spectrally shaping conversion noise, wherein the DAC converts a digital input signal to a nominally equivalent analog output signal, comprising:

(a) a signal divider block for splitting the input signal into a first and a second signal component;

(b) a mismatch-shaping DAC block having an input adapted to receive the first component, wherein the mismatch-shaping DAC block spectrally shapes the first component and provides the spectrally shaped first component as inputs to a first plurality of internal DAC elements;

(c) a DAC block having an input adapted to receive the second component, wherein the DAC block includes a second plurality of internal DAC elements, and wherein each of the DAC elements generate an analog output signal nominally equivalent to the signal presented at its respective input; and (d) an adder, coupled to the outputs of the DAC elements, wherein the adder outputs the analog output signal, wherein no spectral shaping is performed on the second component of the input signal.

2. The mismatch-shaping DAC as set forth in claim 1, wherein the first component of the input signal comprises values of the input signal that are small in magnitude, and wherein the second component comprises values of the input signal that are larger in magnitude than the first component values of the input signal.

3. The mismatch-shaping DAC as set forth in claim 1, wherein the first component of the input signal comprises values of the input signal that fall within a predetermined range about a mid-scale point.

4. The mismatch-shaping DAC as set forth in claim 1, wherein the input signal is generated by an output of a digital delta-sigma modulator, and wherein the analog output signal is input to a reconstruction analog lowpass filter chain.

5. The mismatch-shaping DAC as set forth in claim 4, wherein an input of the digital delta-sigma modulator is coupled to an interpolation filter.

6. The mismatch-shaping DAC as set forth in claim 1, wherein the internal DAC elements comprise 8 one-bit DACs.

7. The mismatch-shaping DAC as set forth in claim 1, wherein the internal DAC elements comprise 16 one-bit DACs.

8. The mismatch-shaping DAC as set forth in claim 1, wherein the internal DAC elements comprise multiple-bit DACs.

9. The mismatch-shaping DAC as set forth in claim 1, wherein the mismatch-shaping DAC spectrally shapes the first component of the input signal by permuting the first component to associated and respective inputs of the first plurality of internal DAC elements.

10. The mismatch-shaping DAC as set forth in claim 1, wherein the mismatch-shaping DAC spectrally shapes the first component of the input signal using a tree-structured switching block architecture.

11. The mismatch-shaping DAC as set forth in claim 1, wherein the mismatch-shaping DAC is configured to spectrally shape the first component of the input signal in accordance with a butterfly shuffler algorithm.

12. The mismatch-shaping DAC as set forth in claim 1, wherein the mismatch-shaping DAC is used in a Bluetooth wireless communications device.

13. A mismatch-shaping digital-to-analog converter (DAC) partially mismatch-shaping noise contributed by mismatched components of the converter, wherein the DAC converts a digital input signal to a nominally equivalent analog output signal, comprising:
   (a) means for separating the input signal into first and second signal components;
   (b) means, coupled to the separating means, for spectrally shaping the first signal component and converting the first signal component into a first plurality of analog signals;
   (c) means, coupled to the separating means, for converting the second signal component into a second plurality of analog signals; and
   (d) adder means, having inputs coupled to the first and second plurality of analog signals, wherein the adder means generates the analog output signal,
wherein mismatch-shaping is performed on the first signal component, and wherein mismatch-shaping is not performed on the second signal component.

14. A mismatch-shaping digital-to-analog converter (DAC) wherein the DAC converts a digital input signal to a nominally equivalent analog output signal, comprising:
   (a) means for separating the input signal into first and second signal components;
   (b) means, coupled to the separating means, for permuting the first signal component to inputs of a first plurality of internal DAC elements, wherein the first plurality of internal DAC elements generate a first plurality of analog signals;
   (c) means, coupled to the separating means, for encoding the second signal component, wherein the encoded second signal component is input to a second plurality of internal DAC elements, and wherein the second plurality of internal DAC elements generate a second plurality of analog signals; and
   (d) adder means, having inputs coupled to the first and second plurality of analog signals, wherein the adder means generates the analog output signal,
wherein mismatch-shaping is performed on the first signal component, and wherein mismatch-shaping is not performed on the second signal component.

15. The mismatch-shaping DAC as set forth in claim 14, wherein the encoding means encodes the second signal component using a thermometer code before providing the encoded second signal component as input to the second plurality of internal DAC elements.

16. The mismatch-shaping DAC as set forth in claim 14, wherein the encoding means passes the second signal component through to respective and associated inputs of the second plurality of internal DAC elements when the digital input signal is originally encoded using a thermometer code.

17. A method of converting digital input signals to nominally equivalent analog output signals in a digital-to-analog converter (DAC), wherein the DAC includes a plurality of internal DAC elements, the method comprising the steps of:
   (a) sampling a digital input signal;
   (b) separating the digital input signal into a first and second component;
   (c) spectrally shaping the first component of the input signal and providing the spectrally-shaped first component to inputs of a first plurality of internal DAC elements and thereby mismatch-shaping the first plurality of internal DAC elements;
   (d) inputting the second component of the input signal to inputs of a second plurality of internal DAC elements; and
   (e) converting the spectrally-shaped first component and the second component to produce an analog output signal that is nominally equivalent to the digital input signal sampled at step (a);
wherein the second component of the input signal is not spectrally shaped.

18. The method of converting digital input signals as set forth in claim 17, wherein the steps (a)–(e) are performed in parallel.

19. The method of converting digital input signals as set forth in claim 17, wherein the first component of the input signal comprises values of the input signal close to mid-scale, and where the second component comprises values of the input signal that are large in magnitude as compared to the first component.

20. The method of converting digital input signals as set forth in claim 17, wherein the step (c) of spectrally shaping the first component of the input signal and providing the spectrally-shaped first component to inputs of a first plurality of internal DAC elements comprises the following sub-steps:
   (i) receiving a digital input signal in a first switching block layer of a plurality of switching block layers;
   (ii) splitting the digital signal into two output signals, wherein each of the two output signals has a value in the range of $\{0, 1, \ldots, 2k-1\}$, wherein k is a layer number, and wherein a sum of the output signals equals the digital input signal;
   (iii) repeating sub-steps (i) and (ii) for each of the plurality of switching block layers, wherein the output signals of a k layer are the digital input signals for a k−1 layer;
   (iv) converting the output signals of a last switching block layer into a plurality of analog signals; and
   (v) combining the plurality of analog signals into a converted signal.

21. A delta-sigma modulator using mismatch-shaping of digital-to-analog conversion errors caused by mismatched circuit components, comprising:
   (a) a first adder having first and second inputs and an output, wherein the first input is adapted to receive an analog input signal;
   (b) a first integrator having an input coupled to the output of the first adder, and having an output;
   (c) a second adder having first and second inputs and an output, wherein the first input of the second adder is coupled to the output of the first integrator;
   (d) a second integrator having an input coupled to the output of the second adder, and having an output;
   (e) an internal flash ADC operatively coupled to the output of the second integrator, wherein the ADC generates a digital output signal; and
   (f) at least one feedback partial mismatch-shaping DAC having an input coupled to the digital output signal, and an output, wherein the at least one partial mismatch-shaping DAC includes:
      (1) a splitter block for splitting the digital output signal into a first and a second signal component;
      (2) a mismatch-shaping DAC block having an input adapted to receive the first signal component, wherein the mismatch-shaping DAC block spectrally shapes the first component and provides the spectrally-shaped first component to inputs of a first plurality of internal DAC elements;

(3) a DAC block having an input adapted to receive the second signal component wherein the DAC block includes a second plurality of internal DAC elements, and wherein each of the DAC elements generate an analog signal nominally equivalent to the signal presented at its respective input; and (4) an adder, coupled to the outputs of the internal DAC elements, wherein the adder outputs an analog feedback signal, wherein no spectral shaping is performed on the second signal component, and wherein the analog feedback signal is coupled to the second inputs of the first and second adders.

22. The delta-sigma modulator as set forth in claim 21, wherein the digital output signal generated by the internal ADC is coupled to a decimation filter.

23. A delta-sigma digital-to-analog converter (DAC) using mismatch-shaping of digital-to-analog conversion noise, wherein the DAC converts a digital input signal to a nominally equivalent analog output signal, comprising:

(a) an interpolation filter having an input adapted to receive the digital input signal and having an output;

(b) a digital delta-sigma modulator coupled to the output of the interpolation filter, wherein the delta-sigma modulator outputs a quantized digital output signal;

(c) a partial mismatch-shaping DAC having an input coupled to the quantized digital output signal, wherein the mismatch-shaping DAC includes:

(1) means for splitting the quantized digital output signal into a first and a second signal component;

(2) a mismatch-shaping DAC block having an input adapted to receive the first component, wherein the mismatch-shaping DAC block spectrally shapes the first component and provides the spectrally-shaped first component to inputs of a first plurality of internal DAC elements;

(3) a DAC block having an input adapted to receive the second signal component wherein the DAC block includes a second plurality of internal DAC elements, and wherein each of the DAC elements generate an analog signal nominally equivalent to the signal presented at its input; and (4) an adder, coupled to the outputs of the internal DAC elements, wherein the adder outputs an analog output signal, and wherein no spectral shaping is performed on the second signal component; and (d) a reconstruction lowpass filter chain having an input coupled to the analog output signal.

\* \* \* \* \*